(12) United States Patent
Imada et al.

(10) Patent No.: US 6,269,551 B1
(45) Date of Patent: Aug. 7, 2001

(54) METHOD OF DRYING COPPER FOIL AND COPPER FOIL DRYING APPARATUS

(75) Inventors: Nobuyuki Imada, Hasuda; Kazuhide Oshima, Ageo, both of (JP)

(73) Assignee: Mitsui Mining & Smelting Co., Ltd. (JP)

( * ) Notice: Subject to any disclaimer, the term of this patent is extended or adjusted under 35 U.S.C. 154(b) by 0 days.

(21) Appl. No.: 09/354,626

(22) Filed: Jul. 16, 1999

(30) Foreign Application Priority Data

Jul. 17, 1998 (JP) .................................................. 10-203692

(51) Int. Cl.$^7$ ................................ F26B 3/34; C07C 1/00; C25C 5/00; C25C 15/00; C25D 5/10
(52) U.S. Cl. ........................ 34/266; 34/273; 204/157.15; 205/109; 205/111; 205/170; 205/177; 205/178; 205/181; 205/191; 205/224
(58) Field of Search ...................... 204/157.15; 205/109, 205/111, 170, 177, 178, 181, 224, 191; 34/266, 273

(56) References Cited

U.S. PATENT DOCUMENTS 5,261,165 * 11/1993 Tate ........................................ 34/1 W
5,962,577 * 10/1999 Mori et al. ............................ 524/512

OTHER PUBLICATIONS

"American Institute of Physics Handbook," McGraw–Hill Book Company, Inc., 2$^{nd}$ Edition, pp. cover, 6–120, 6–121, (no date).

* cited by examiner

Primary Examiner—Edna Wong
(74) Attorney, Agent, or Firm—Jenkens & Gilchrist (57) ABSTRACT

A method employed to dry a copper foil having been subjected to various surface treatments, which method comprises irradiating at least one surface-treated side of the copper foil with near infrared rays to dry the copper foil, and an apparatus suitable to the method. The drying of the copper foil having undergone surface treatments can be accomplished by a simple apparatus with low electric power while controlling the heating of the surface of the copper foil so that the drying temperature can be held at 100° C. or higher at which a eutectic alloying of rust preventive metal and copper foil, for example, alloying (brass formation) of zinc and copper on the surface of the copper foil is effected.

11 Claims, 5 Drawing Sheets

Relationship between copper foil drying temperature and peel strength

○ Near I.R. ray drying
■ Hot air drying

METHOD OF DRYING COPPER FOIL AND COPPER FOIL DRYING APPARATUS

FIELD OF THE INVENTION

The present invention relates to a method of drying a copper foil and a copper foil drying apparatus for use in the method. In particular, the present invention relates to a method of drying the copper foils used in copper clad laminates, each of such laminates comprising an insulating resin clad with a copper foil, the copper clad laminates are used, for example, in printed wiring boards, the invention also relates to a copper foil drying apparatus used in the method.

BACKGROUND OF THE INVENTION

The demand for printed wiring boards having electronic components such as IC (integrated circuits) and LSI (large scale integrated circuits) mounted thereon is rapidly increasing in accordance with the progress of electronic industry.

In the production of the printed wiring boards, kraft paper, glass cloth, glass nonwoven fabric or the like are impregnated with a thermosetting resin such as a phenolic resin or an epoxy resin to obtain a pre-preg. This pre-preg and a copper foil are bonded with each other by, for example, hot pressing. Thereafter, resist printing and masking film lamination are used to form circuit patterns. Unwanted portions of the copper foil are etched away with the use of an acid or an alkali to form a desired circuit pattern, and the resist and masking film are removed. After the formation of the desired circuit pattern, electronic components are set at the predetermined positions of the printed wiring board and dipped in a solder bath so that the electronic components are fixed on the printed wiring board.

Two types of copper foils, namely electrodeposited copper foil and rolled copper foil, are available for use in printed wiring boards. These days, however, electrolytic copper foil is more often employed because of its wide applicability and because of the ease and low cost in forming a thinner copper foil.

Electrodeposited copper foil for use in printed wiring boards is conventionally produced through the following process.

That is, a copper sulfate solution is placed in a electrolyzing bath and anodes composed of insoluble electrodes, are disposed in the electrolyzing bath. Furthermore, a rotating cathode drum is disposed in the electrolyzing bath so that almost half of the drum is immersed in the copper sulfate solution and the surface of the drum is opposite to the anodes. Then, high current density is passed through the anodes and cathode drum to produce continuously the copper foil. In this case, the surface of the foil which was in contact with the surface of the cathode drum, is the shiny side of the electrodeposited copper foil and the outer surface of the copper foil is the matte side.

The copper foil obtained through this electrolytic process is subjected to surface treatments. In these surface treatments, nodularization of the copper foil is performed for exerting an anchoring effect when bonding with a substrate, followed by zinc plating, chromating or silane coupling treatments for exerting a passivation effect. Finally, drying is performed to obtain the electrodeposited copper foil for making printed circuits.

On the other hand, in case of as-rolled copper foil, both surface sides of the copper foil are shiny or smooth. One side or both sides of these shiny sides is subjected to a surface treatment.

The copper foil having undergone the above surface treatments, because, for example, the electrolyte adheres to the surface thereof, must be washed with water (not shown) prior to the drying by means of a dryer for removing water from the surface of copper foil.

Therefore, it is common practice to perform drying of the electrolytic copper foil. This drying is generally accomplished by drying using hot air or using far infrared rays. The current situation is that drying by these methods is to about such an extent that the water adhering to the surface of the copper foil is removed and, thus, the drying temperature is held at up to 100° C.

Figure 3:
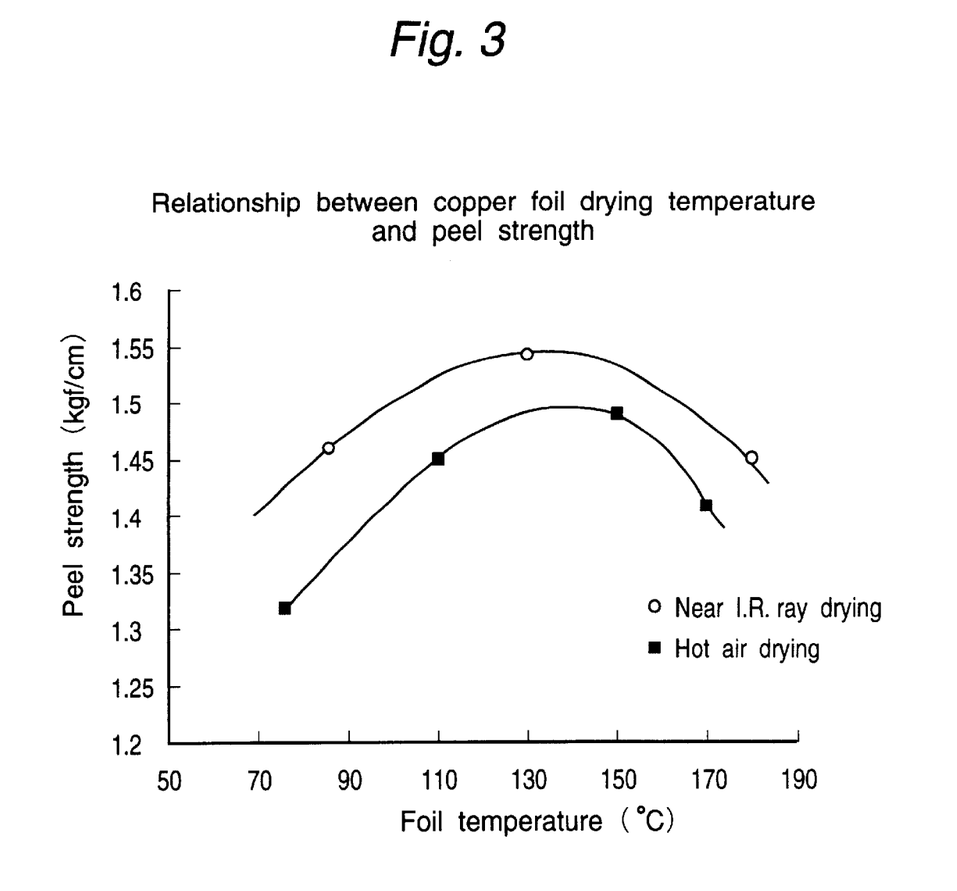
FIG. 3 is a graph showing the relationship between copper foil drying temperature and peel strength.

Heating the surface of the copper foil to 100° C. or higher, for example, causes the zinc of the plated zinc layer provided on the surface of the copper foil to diffuse into the copper foil so that a zinc-copper alloying (brass formation) is effected. As a result, the dezincing phenomenon, which is the leaching of zinc into an acid such as hydrochloric acid used in the formation of circuit pattern, does not occur, thereby enhancing the acid resistance. Further, according to the inventors' investigations, the higher the surface temperature of the copper foil, the greater the peel strength relative to the resin substrate, until a peel strength peak at about 130° C. as shown in FIG. 3.

Figure 5:
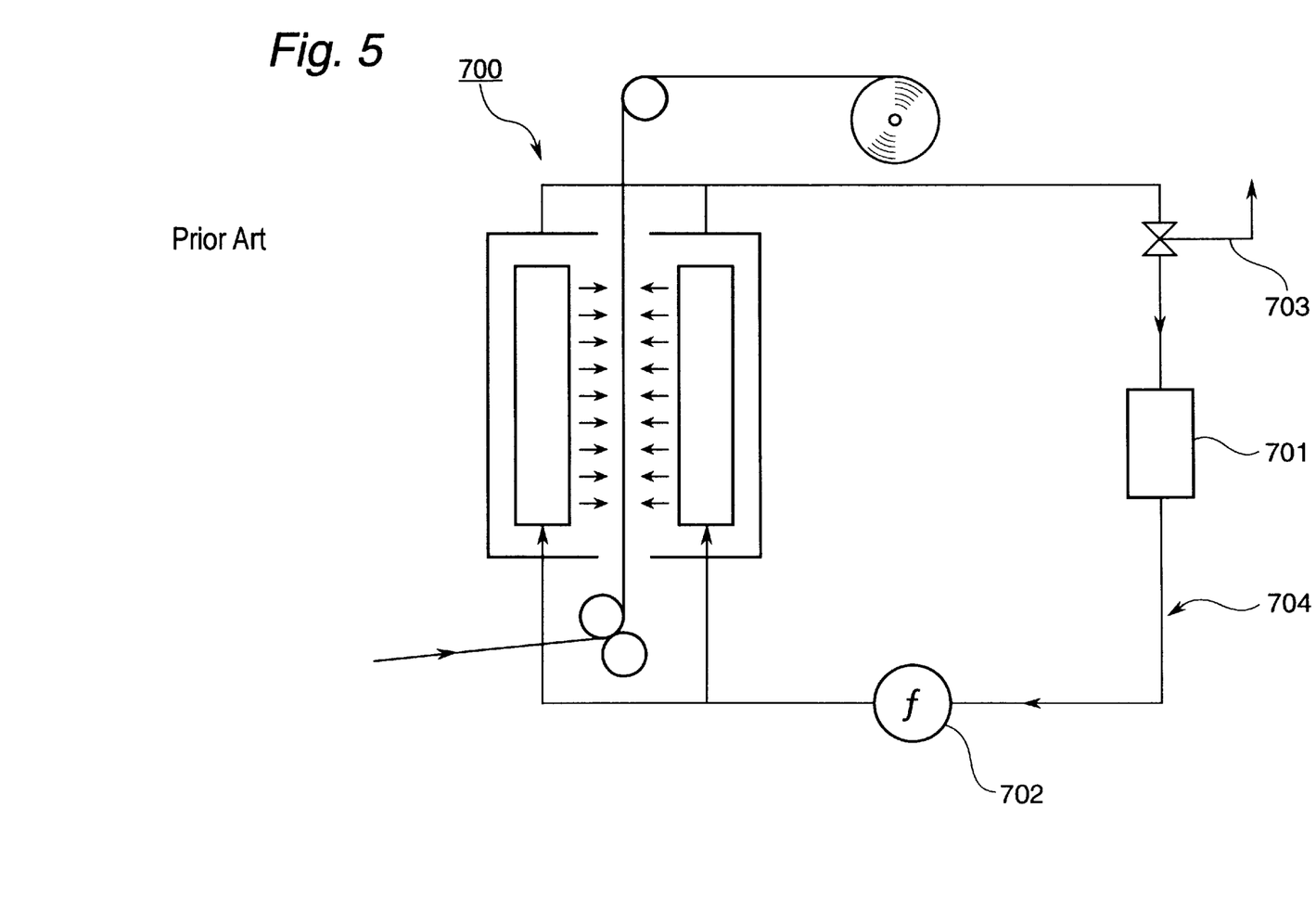
FIG. 5 is a schematic diagram of the conventional hot air drying apparatus.

Drying using hot air enables heating the copper foil and regulating the temperature at 130° C. or higher. However, this method relies on the heating (drying) through the heat transfer from hot air, so that the energy loss attributed to discharged hot air is large. Further, as shown in FIG. 5, hot air drying apparatus 700 requires heater 701, fan 702 and circulation path 704 including path 703 for discharging a large volume of exhaust gas containing steam outside the apparatus. Therefore, unfavorably, the size of the apparatus is large, the space required is large, and the cost is high.

On the other hand, drying using far infrared rays, the surface of the copper foil reflects almost about 97% or more of the far infrared rays whose wavelength range is from 4 to 1000 μm (see pages 6 to 120 of American Institute of Physics Handbook) and, hence, exhibits low absorption of far infrared rays. Therefore, the energy loss is large, and the temperature of the surface of the copper foil cannot be readily increased. Accordingly, a multiplicity of far infrared ray irradiating units must be arranged for attaining temperatures of 130° C. or higher, thereby resulting in disadvantages in terms of apparatus, power consumption and cost.

OBJECT OF THE INVENTION

The present invention has been made taking the above state of the art into account. Accordingly, an object of the present invention is to provide a method of drying a copper foil, by which the drying of surface-treated copper foil can be accomplished by a simple apparatus with low electric power while controlling the heating of the surface of the copper foil so that the drying temperature can be held at 100° C. or higher, at which condition a eutectic alloying of a rust preventive metal and copper foil, for example, alloying (brass formation) of zinc and copper on the surface of the copper foil is effected. Another object of the present invention is to provide a copper foil drying apparatus suitable for use in this method.

SUMMARY OF THE INVENTION

The present invention has been made with a view toward solving the above problems of the prior art and attaining the above object. Thus, the present invention provides a method of drying a copper foil, which has been subjected to surface treatments, which method comprises irradiating a surface or surfaces of the copper foil with near infrared rays to thereby dry the copper foil.

In this invention, term "surface treatments" includes not only nodularization and passivation, but also any other surface treatments, in combination or independently.

In particular, the copper foil drying method of the present invention is characterized in that the copper foil is an electrolytic copper foil.

Near infrared rays are easily absorbed by the copper foil surface so that the copper foil surface can be heated to a given temperature with a high energy efficiency. Also, the copper foil surface can be heated and regulated at a given temperature by changing voltage and electric current applied to a near infrared irradiating unit. As a result, the copper foil surface can be heated and dried at 100° C. or higher at which temperature the alloying (brass formation) of zinc-copper occurs. Not only is the acid resistance improved but also, the bonding strength to a resin substrate is increased, thereby exhibiting an increased peel strength and avoiding separation of the copper foil from the resin substrate.

Further, the copper foil drying method of the present invention may be characterized in that at least one surface-treated side of the copper foil is irradiated with near infrared rays to dry the copper foil.

In this instance, the absorptivity of near infrared rays is increased on the surface-treated side of the copper foil, so that the heating and drying of the copper foil surface can be done with enhanced energy efficiency.

Still further, the copper foil drying method of the present invention may be characterized in that fine particles are applied to a copper foil surface to roughen the copper foil surface and the modularized surface of the copper foil is irradiated with near infrared rays.

Surface nodularization for increasing the bonding strength (peel strength) with a resin substrate, is performed prior to passivation, and thereafter the modularized surface is irradiated with near infrared rays. Thus, by virtue of the unevenness formed by the nodularization, the absorptivity of near infrared rays is increased to enable heating and drying of the copper foil surface with enhanced energy efficiency.

Still further, the copper foil drying method of the present invention may be characterized in that the copper foil surface is furnished with passivation and, thereafter, the nodularized surface of the copper foil is irradiated with near infrared rays.

It is preferred that the passivation comprise applying a rust preventive metal preferably, at least one rust preventive metal selected from the group consisting of Zn, Ni, Sn, Cr, Mo and Co.

Furthermore, the copper foil drying method of the present invention may be characterized in that the drying by near infrared irradiation be performed under conditions such that the surface of the copper foil has a temperature of 100 to 170° C., preferably 120 to 150° C.

When the copper foil surface is heated at 100 to 170° C. the formation of a eutectic alloy of a rust preventive metal and copper foil, for example, alloying (brass formation) of zinc-copper is effected on the copper foil surface. Further, the dezincing phenomenon in which zinc is leached is prevented, thereby enhancing the acid resistance. Still further, the bonding strength with a resin substrate, namely the peel strength, is also enhanced.

In another aspect of the present invention, there is provided a copper foil drying apparatus for drying a copper foil which has been subjected to various surface treatments, which apparatus comprises a drying chamber and, arranged therein, a near infrared irradiating unit, said drying chamber adapted to allow the copper foil to be continuously fed therethrough, said near infrared irradiating unit arranged opposite to a surface-treated side of the copper foil so that at least the surface-treated side of the copper foil is irradiated with near infrared rays.

In particular, the copper foil drying apparatus of the present invention is characterized in that the copper foil is an electrodeposited copper foil.

Further, the copper foil drying apparatus of the present invention may be characterized in that it further comprises means for controlling output to near infrared ray lamps of the near infrared irradiating unit so that the surface of the copper foil has a controlled drying temperature.

In this construction, lead time required for start-up of near infrared ray lamps is short, so that the temperature is rapidly raised to the desired level. Moreover, the surface temperature of the copper foil can continuously be regulated by controlling the voltage or electric current applied to near infrared ray lamps. Therefore, the drying can be performed while heating and regulating the copper foil surface at 100 to 170° C. so that the formation of a eutectic alloy of rust preventive metal and copper foil, for example, alloying (brass formation) of zinc-copper is effected on the copper foil surface to enhance the acid resistance, and inhibit the dezincing phenomenon (leaching) and so that the bonding strength with a resin substrate, namely the peel strength, is also enhanced.

Still further, the copper foil drying apparatus of the present invention may be characterized in that near infrared ray irradiating units are arranged so that these face each other with the copper foil interposed therebetween, the apparatus provided with control means for selectively operating either a near infrared irradiating unit arranged on one side or near infrared irradiating units arranged on both sides in conformity with surface condition of the copper foil fed through the drying chamber.

When the electrodeposited copper foil is dried with only its matte side subjected to nodularization, passivation, etc., this apparatus selectively operates the near infrared irradiating unit arranged on the one side. For the shiny side treated electrodeposited copper foil having a shiny side bond enhancing treatment in order to increase the insulation reliability after etching or to enhance the circuit characteristics, this apparatus selectively operates the near infrared ray irradiating units arranged on both sides. Thus, there is no limit on the copper foil to be dried.

DETAILED DESCRIPTION OF THE INVENTION

Embodiments (Examples) of the present invention will be described below with reference to the drawings.

Figure 1:
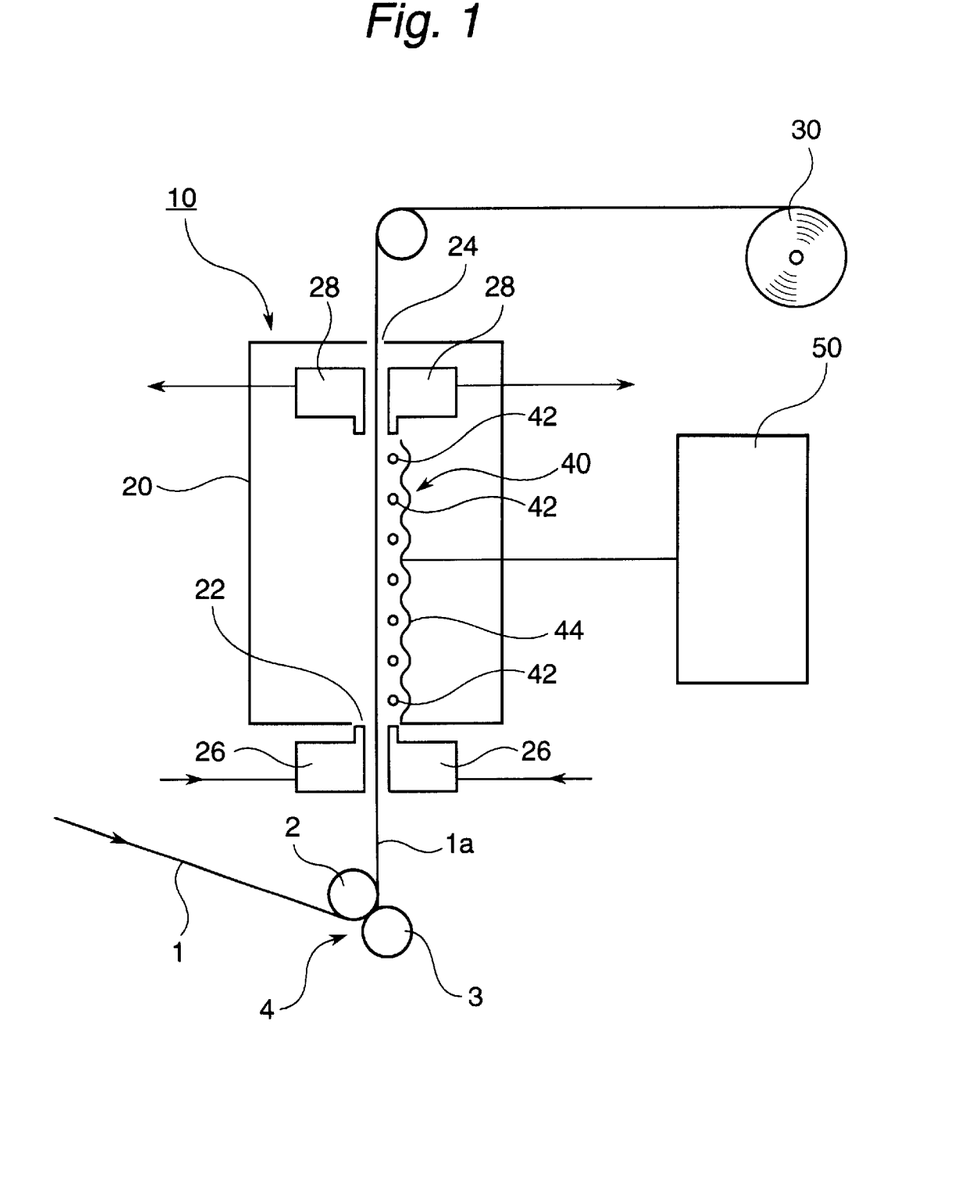
FIG. 1 is a schematic sectional view of the first form of drying apparatus for use in carrying out the copper foil drying method of the present invention.

FIG. 1 is a schematic sectional view of the first form of drying apparatus for use in carrying out the copper foil drying method of the present invention.

The copper foil is obtained by the conventional foil producing process in which an acidic copper sulfate solution is fed into an electrolytic cell and copper is deposited by electrolysis on a rotating cathode drum arranged opposite to an insoluble anode and after which copper is continuously wound up. The matte side of electrodeposited copper foil is subjected to surface treatment steps including, for example, nodularization, zinc plating and chromating steps and, as required, further subjected to a silane coupling treatment step for increasing the bonding strength with a resin substrate. The electrolyte and other matter adhere to the surface of the copper foil having undergone these surface treatment steps. Therefore, the copper foil must be washed with water, although not shown, prior to being fed to the drying step for removing water from the copper foil surface by means of a dryer.

Accordingly, referring to FIG. 1, the copper foil 1 having undergone these surface treatments is passed between rolls 2, 3 so that water, etc. are squeezed off to a certain degree. The squeezed copper foil 1 is fed through copper foil inlet opening 22 disposed at a lower side of drying apparatus body 20 of drying apparatus 10, dried inside the drying apparatus body 20 and discharged through copper foil outlet opening 24 disposed at an upper side of the drying apparatus body 20 The dried copper foil 1 discharged through the copper foil outlet opening 24 is wound on wind-up roll 30

Inside the drying apparatus body 20 near infrared ray irradiating unit 40 is arranged in a direction parallel to the direction of feeding the copper foil 1 and a direction opposite to a surface treatment matte side 1a of the copper foil 1. A plurality of mutually parallel halogen lamps 42 are disposed in a direction parallel to the direction of feeding of the copper foil in the near infrared ray irradiating unit 40 The halogen lamps 42 are backed with a deflector 44 having a specular surface such that near infrared rays emitted from the halogen lamps 42 are reflected to irradiate the surface-treated matte side 1a of the copper foil 1.

Moreover, air feeding unit 26 is disposed in the vicinity of the copper foil inlet opening 22 of the drying apparatus body 20 so that, by means of a blower not shown, outside dry fresh air is introduced into the drying apparatus body 20 On the other hand, exhaust unit 28 is disposed in the vicinity of the copper foil outlet opening 24 of the drying apparatus body 20 so that the air containing steam evaporated from the surface of the copper foil 1 is exhausted from the drying apparatus body 20. These accelerate the evaporation of moisture from the surface of the copper foil 1.

The individual halogen lamps 42 of the near infrared irradiating unit 40 are connected to control unit 50. Thus, the output of the halogen lamps 42 toward the surface of the copper foil 1, is regulated by controlling the voltage or electric current supplied to the individual halogen lamps 42 by means of the control unit 50 to enable regulating the temperature of the surface-treated side 1a of the copper foil 1 during drying.

The above control of voltage or electric current can be done by, for example, the ON-OFF controlling method in which the time is regulated by voltage ON-OFF, the phase controlling method in which voltage/electric current regulation and control are carried out or the zero cross switching method in which the loading power time ratio is regulated (ON-OFF control).

With respect to the method of controlling the voltage or electric current by means of the control unit 50, although the control can be done so that all the individual halogen lamps 42 have the same values of voltage or electric current, the control can also be done so that the individual halogen lamps 42 have selected values of voltage or electric current or so that the voltage or electric current applied to the individual halogen lamps 42 is selectively switched on or off.

Further, with respect to the method of controlling the voltage or electric current applied to the halogen lamps 42, automatic continuous control can be effected by disposing a temperature sensor in the vicinity of the surface-treated side 1a of the copper foil 1, although not shown, and controlling the voltage or electric current supplied to the halogen lamps 42 by means of the control unit 50 on the basis of the temperature detected by the temperature sensor.

Regarding the wavelength of near infrared rays, it is preferred that the wavelength peak be in the range of 0.8 to 2 $\mu$m, especially 1 to 1.5 $\mu$m, so that the surface of the copper foil 1 has a high absorptivity of near infrared rays. Therefore, it is desirable to regulate the wavelength of emitted near infrared rays so as to fall within the above range by raising the temperature of the halogen lamps 42 to 2000'–2200° C. by controlling the voltage or electric current applied to the halogen lamps 42 by means of the control unit 50. By virtue of this control, the temperature of the surface-treated side 1a of the copper foil 1 is preferably set at 100 to 170° C., more preferably 120 to 150° C.

Referring to FIG. 3, the peel strength from the resin substrate is increased in accordance with the increase of the temperature of the surface of the copper foil 1. The peel strength reaches its peak at about 130° C. When the surface of the copper foil 1 is heated at 100° C. or higher, for example, zinc contained in the zinc plating layer formed on the copper foil surface is diffused into the copper foil to effect the alloying (brass formation) of zinc-copper. Thus, the dezincing phenomenon, namely the leaching of zinc into an acid such as hydrochloric acid used in the formation of circuit patterns, would not occur, thereby realizing an enhancement of acid resistance. Accordingly, taking into account both the formation of a eutectic alloy from rust preventive metal and copper foil and the peel strength representing the bonding strength with the resin substrate, the temperature of the surface-treated side 1a of the copper foil 1 is preferably set at 100 to 170° C., more preferably 120 to 150° C. When the temperature of the surface-treated side 1a of the copper foil 1 is lower than 100° C., the formation of a eutectic alloy from rust preventive metal and copper foil such as the alloying (brass formation) of zinc-copper would not occur at the surface of the copper foil 1 with the result that the acid resistance is not satisfactory. On the other hand, when the temperature of the surface-treated side 1a of the copper foil 1 is higher than 170° C. the chromate used as a rust preventive is destroyed although the advance of the alloying is rapid. The bonding strength between the copper foil 1 and the resin substrate, namely the peel strength is lowered.

The residence time of the copper foil 1 in the drying apparatus body 20 is generally about 10 sec from the viewpoint of the capacity of facilities.

From the viewpoint of energy efficiency, it is preferred that the distance between the halogen lamps 42 and the surface-treated side 1a of the copper foil 1 be set at 20 to 100 mm, especially 30 to 50 mm.

By irradiating the surface-treated side 1a of the copper foil 1 with near infrared rays as described above, near infrared rays are easily absorbed by the copper foil surface, so that the copper foil surface can be heated to a given temperature with a high energy efficiency. Moreover, the copper foil surface can be heated and regulated at a given temperature by changing voltage and electric current outputs applied to near infrared ray lamps of a near infrared irradiating unit. As a result, the copper foil surface can be heated and dried at 100° C. or higher at which the formation of a eutectic alloy from rust preventive metal and copper foil such as the alloying (brass formation) of zinc-copper is carried out, so that not only is the acid resistance improved but also, when bonding with a resin substrate, the bonding strength, namely the peel strength, is increased to avoid separation of the copper foil from the resin substrate.

Figure 2:
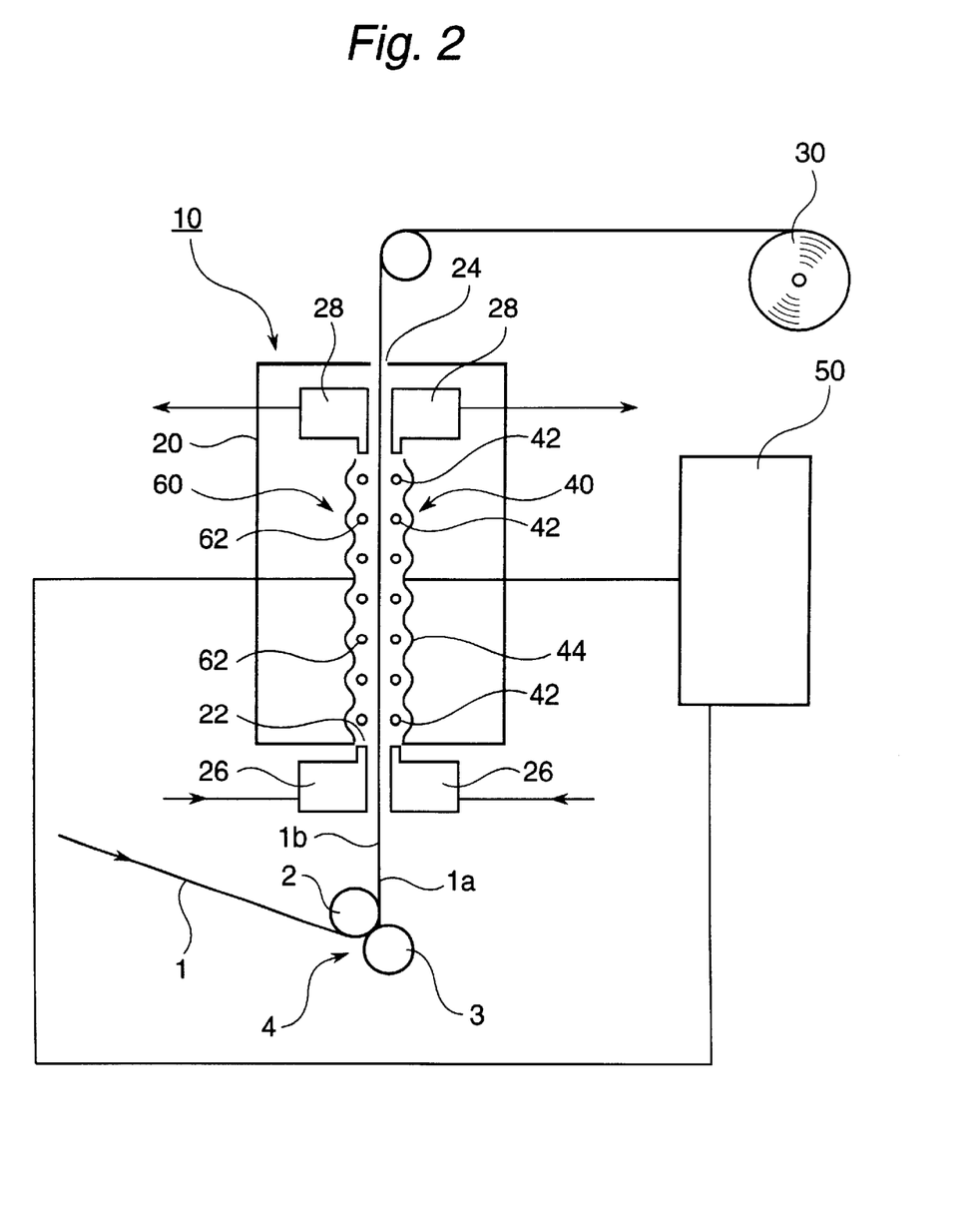
FIG. 2 is a schematic sectional view of the second form of drying apparatus for use in carrying out the copper foil drying method of the present invention.

FIG. 2 is a schematic sectional view of the second form of drying apparatus for use in carrying out the copper foil drying method of the present invention.

This form of drying apparatus has a structure similar to that of the above first form of drying apparatus. Like reference numbers are employed to designate fundamentally like structural members throughout FIGS. 1 and 2, and the detailed description thereof will not be repeated.

This form of drying apparatus 10 is different from the above first form of drying apparatus in that near infrared ray unit 60 like the near infrared ray irradiating unit 40 is disposed in a vertical direction opposite to a surface-treated shiny side 1b of the copper foil 1 inside the drying apparatus body 20. The structure of this near infrared ray unit 60 is the same as that of the near infrared ray irradiating unit 40 of the above first form of drying apparatus, so that detailed description thereof will not be repeated.

Depending on the type of copper foil, the surface-treated shiny side may be a substrate bonding side in order to improve the circuit characteristics and the insulation reliability after etching, and the shiny side 1b may be roughened in order to increase the adherence to the substrate. In this instance, the surface-treated shiny side 1b is a nodularized surface, so that near infrared rays can be absorbed. Therefore, the drying of the copper foil 1 can be carried out with enhanced energy efficiency by simultaneously irradiating the surface-treated shiny side 1b with near infrared rays to dry the copper foil surface.

In this drying apparatus 10, the individual halogen lamps 62 of the near infrared ray unit 60 are connected to the control unit 50 in the same manner as in the above near infrared ray irradiating unit 40. Thus, the output of the halogen lamps 62, namely the level of radiation of near infrared rays emitted from the halogen lamps 62 toward the shiny side 1b of the copper foil 1, is regulated by controlling the voltage or electric current supplied to the individual halogen lamps 62 from the power source by means of the control unit 50 to enable regulating the temperature of the shiny surface 1b of the copper foil 1 during the drying.

This drying apparatus can be so constructed as to enable selectively operating either one or both of the near infrared ray irradiating unit 40 and the near infrared ray unit 60 by means of the control unit 50.

Therefore, when the copper foil is dried with only its surface-treated matte side subjected to bond enhancing restatement, for instance, nodularization, passivation, etc., this apparatus selectively operates the near infrared irradiating unit arranged on that side. For copper foil having its shiny side roughened in order to increase the insulation reliability after etching or to enhance the circuit characteristics, this apparatus selectively operates the near infrared ray irradiating units arranged on both sides. Thus, there is no limit on the copper foil to be dried.

In the above first and second forms of drying apparatus 10, in place of the use of the near infrared ray irradiating units 40, 60 only, it is naturally feasible to employ a hot air dryer or a far infrared ray irradiating unit, although not shown, in combination with the near infrared ray irradiating units 40, 60.

In the above embodiments the copper foil having been subjected to surface treatment steps including, for example, nodularization, zinc plating and chromating steps and, as needed, further subjected to a silane coupling treatment step for increasing the bonding strength with a resin substrate is dried by means of the drying apparatus to remove water from the copper foil surface. However, drying by means of the drying apparatus may be done after any of these steps or after a combination of steps selected from thereamong. Furthermore, these passivation steps are not limited to those mentioned above, and may include, for example, a rust preventive treatment in which at least one rust preventive metal selected from the group consisting of Zn, Ni, Sn, Cr, Mo and Co.

Moreover, although in the above embodiments the electrodeposited copper foil has been employed as the copper foil to be dried, the present drying is naturally applicable to, for example, a rolled copper foil which is subjected to surface treatments such as nodularization, passivation and the like.

EFFECT OF THE INVENTION

In the present invention, the near infrared rays with which the copper foil surface is irradiated to thereby dry the copper foil are easily absorbed by the copper foil surface, so that the copper foil surface can be heated to a given temperature with a high energy efficiency. Moreover, the copper foil surface can be heated and regulated at a given temperature by changing voltage and electric current outputs applied to the unit irradiating near infrared rays.

As a result, the copper foil surface can be heated and dried at 100° C. or higher at which the alloying (brass formation) of zinc-copper occurs, so that not only is the acid resistance improved but also, the bonding strength with a resin substrate is increased to provide increased peel strength and avoid separation of the copper foil from the resin substrate.

The surface of the copper foil exhibits a low absorption of far infrared rays, so that the energy loss is large. Much time and energy must be spent for raising the temperature to a given level and, because of poor efficiency, the apparatus must be large and the residence time of the copper foil therein must be prolonged. Further, the hot air drying also exhibits poor energy efficiency and must be equipped with a heater, a blower and circulation paths including a path for discharging a large volume of exhaust gas containing steam outside the apparatus. Therefore, unfavorably, the size of the apparatus is large, the installation space thereof is large, and the cost is high. With respect to energy efficiency and quick response, the drying method using near infrared rays is strikingly superior to the above far infrared ray and hot air methods.

Therefore, the present invention is remarkably excellent in view of the many effects including the compact apparatus, high energy efficiency, capability of heating and drying the copper foil surface at a given temperature, enhancement of acid resistance and production of copper foil exhibiting a high bonding strength when bonded with a resin substrate

EXAMPLE

The present invention will now be illustrated in greater detail with reference to the following Examples, which in no way limit the scope of the invention.

Example 1

Electrodeposited copper foil having a thickness of 35 μm was electrolyzed in an acidic copper sulfate solution so that the electrodeposited copper foil was provided with copper plating to roughen the matte side of the electrodeposited copper foil. Thus, the copper foil having its matte side overlaid with a particulate copper layer was obtained (nodularization).

The resultant copper foil was electrolyzed in a zinc solution bath of pH 11.0 containing 10 g/L. of zinc pyrophosphate and 100 g/L. of potassium pyrophosphate at room temperature at a current density of 5 A/m² for 6 sec so that the copper foil on its matte side was overlaid with 400 mg/m² (in terms of zinc) of a zinc plating.

Subsequently, the zinc plated copper foil was electrolyzed in a chromating solution of pH 10 containing 2 g/L. of chromic acid at room temperature at a current density of 0.5 A/m² for 5 sec so that the copper foil surface on its matte side was overlaid with a chromate coating layer composed of zinc chromate.

Thereafter, a 5 g/L. aqueous γ-glycidoxypropyltrimethoxysilane solution containing 0.5 g/lit. of chromic acid was sprayed on the foil so that a silane coupling treatment was provided for the copper foil. The surface treated copper foil was passed through a water washing bath and then between dewatering rolls and dried by means of the near infrared drying apparatus of the present invention as shown in FIG. 1.

The drying of the copper foil was performed under various temperature conditions by regulating output voltage applied to the near infrared ray lamps while measuring the temperature of the surface-treated matte side of the copper foil by the change of color of a thermotape stuck to the shiny side of the copper foil.

The dried copper foil was hot-pressed with glass epoxy substrate (produced by NELCO) and etched in 10 mm width. 90° peeling thereof was performed in accordance with Japanese Industrial Standard C-6481 to determine the peel strength.

For comparison, the above copper foil was dried by hot air, in place of near infrared rays, at varied copper foil surface temperatures while checking the change of color of a thermotape stuck to the shiny side of the copper foil. The peel strength thereof was measured in the same manner.

The results are shown in FIG. 3. As apparent from FIG. 3, the peel strength reaches its peak when the drying temperature of the copper foil surface is in the vicinity of 130° C.

It is also apparent that, even at the same temperature employed in the drying of copper foil surface after dewatering, the peel strength is greater when the drying is performed with the use of near infrared rays than when the drying is performed with the use of hot air.

The reason is presumed to be that some texture change is made in the silane coupling layer, chromating layer and zinc plating layer by the irradiation of near infrared rays to thereby increase the adherence to the resin substrate.

Example 2

With respect to the energy required for raising the temperature of the surface of the copper foil after dewatering obtained in the same manner as in Example 1 to given level, near infrared ray, far infrared ray and hot air drying were compared to each other in the power and time spent for raising the temperature of the surface of the copper foil to given level. The results are given in Table 1 and FIG. 4.

TABLE 1

|  | Index of electric energy (KWH/t) for increasing foil temp. to 130° C. |
| --- | --- |
| Near I.R. ray drying | 100 |
| Far I.R. ray drying | 350 |
| Hot air drying | 250 |

Figure 4:
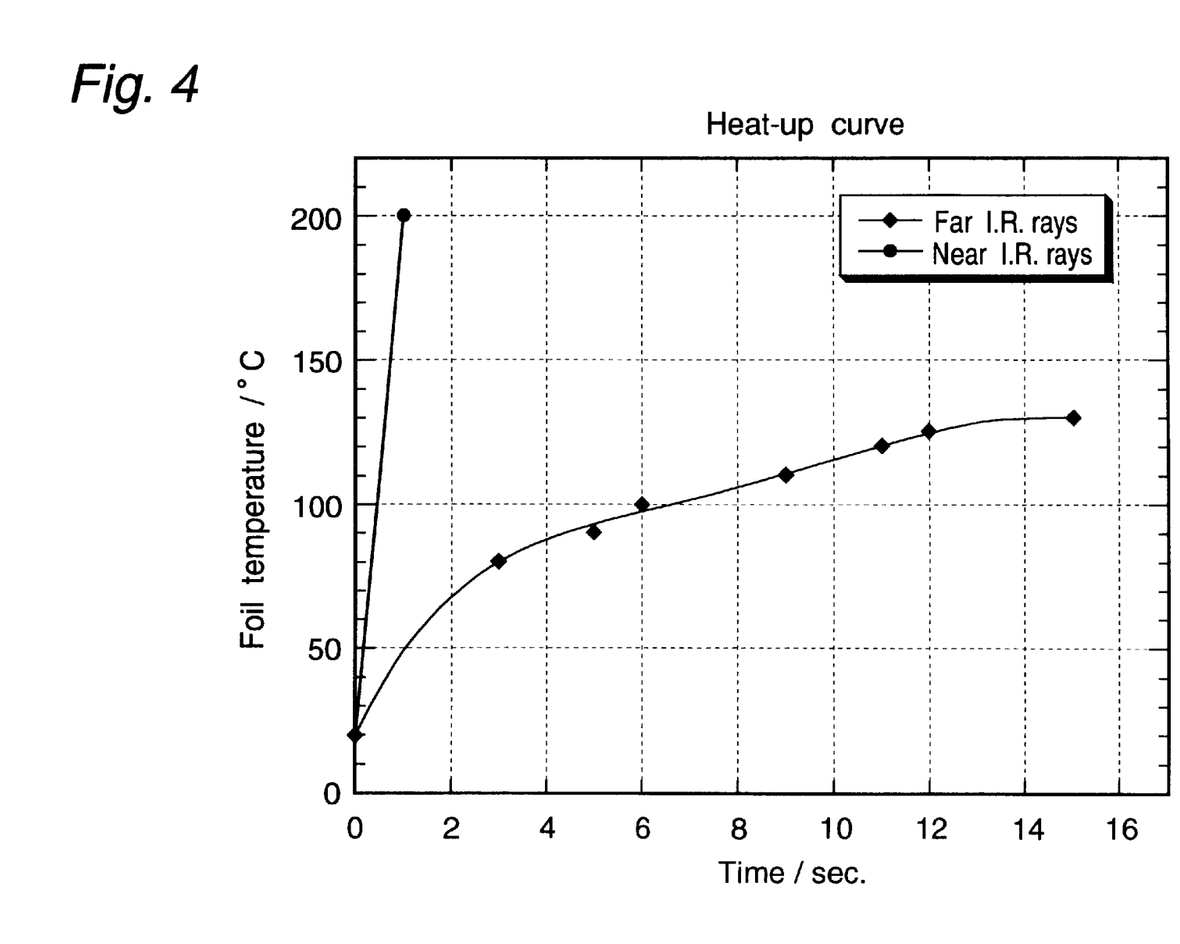
FIG. 4 is a graph showing the relationship between time and foil temperature when the copper foil surface is heated by near infrared rays or far infrared rays.

As apparent from the results of FIG. 4, in the comparison of the time spent for raising the temperature of the surface of the copper foil to 130° C., the time was only 1 sec when near infrared ray drying was used while about 15 sec was needed when far infrared ray drying was used although the far infrared heater had the same capacity as that of the near infrared heater.

Further, as apparent from the results of Table 1, the electric energy per weight required by far infrared ray and hot air drying were 350 and 250, respectively, while that required by the near infrared ray drying was 100, and hence the near infrared ray drying was found to be strikingly superior to the far infrared ray and hot air drying in respect of both energy efficiency and response characteristics.

Example 3

Copper foils produced by drying after dewatering in the same manner as in Example 1 with the use of near infrared rays at varied copper foil surface drying temperatures were hot-pressed to glass epoxy substrates, etched in 0.8 mm width and immersed in a 12% hydrochloric acid solution at room temperature for 30 min to thereby compare the acid resistances thereof with each other.

For comparison, the copper foils were dried by hot air at the same varied drying temperatures, and the acid resistances thereof were compared with each other.

The results are given in Table 2 below.

TABLE 2

|  |  | Drying temp. (° C.) | Peel loss after HCL (%) |
| --- | --- | --- | --- |
| Near I.R. ray drying | 1 | 85 | 21 |
|  | 2 | 110 | 6 |
|  | 3 | 150 | 0 |
|  | 4 | 170 | 12 |
| Hot air drying (Comp.) | 5 | 85 | 22 |
|  | 6 | 110 | 10 |
|  | 7 | 150 | 6 |

It is apparent from the results of Table 2 that the hydrochloric acid resistance (improvement of peel loss after HCL) is enhanced by near infrared ray drying conducted with the drying temperature of the surface of the copper foil held at 100° C. or higher. The reason is that, at 100° C. or higher, the zinc of the zinc plating is diffused into the copper foil to thereby form a copper-zinc binary eutectic alloy with the result that the dezincing phenomenon can be avoided.

Similar results are obtained in the hot air drying as well.

What is claimed is:

1. A method of drying a copper foil after nodularization and passivation surface treatments, comprising irradiating one surface or both surfaces of the copper foil with near infrared irradiation to thereby dry water from the copper foil after said surface treatments.

2. The method as claimed in claim 1, wherein the copper foil is an electrodeposited copper foil.

3. The method as claimed in claim 1, wherein at least one surface-treated side of the copper foil is irradiated with said near infrared irradiation to dry the copper foil.

4. The method as claimed in claim 1, wherein said nodularization comprises depositing fine particles on the surface of the copper foil prior to said passivation.

5. The method as claimed in claim 4, wherein the passivation comprises applying a rust preventive metal.

6. The method as claimed in claim 5, wherein the passivation comprises applying at least one rust preventive metal selected from the group consisting of Zn, Ni, Sn, Cr, Mo and Co.

7. The method as claimed in any one of claims 1 to 6, wherein the drying by said near infrared irradiation is done under a condition such that the surface or surfaces of the copper foil have a temperature of 100 to 170° C.

8. The method of claim 7, wherein the surface or surfaces of the copper foil have a temperature of about 120°–150° C.

9. The method of claim 7, wherein the surface or surfaces of the copper foil have a temperature of about 130° C.

10. The method of claim 1, wherein said near infrared rays have wavelengths of about 0.8 to 2 $\mu$m.

11. The method of claim 10, wherein said near infrared rays have wave lengths of about 1–1.5 $\mu$m.

* * * * *